(12) United States Patent
Moon

(10) Patent No.: US 8,197,991 B2
(45) Date of Patent: Jun. 12, 2012

(54) MANUFACTURING METHOD OF A SEMICONDUCTOR DEVICE

(75) Inventor: Jae In Moon, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 987 days.

(21) Appl. No.: 12/163,893

(22) Filed: Jun. 27, 2008

(65) Prior Publication Data

US 2009/0233184 A1 Sep. 17, 2009

(30) Foreign Application Priority Data

Mar. 11, 2008 (KR) .................. 10-2008-0022620

(51) Int. Cl.
*G03F 1/00* (2006.01)
*G03F 7/20* (2006.01)
(52) U.S. Cl. ............. 430/5; 430/313; 430/323; 430/396
(58) Field of Classification Search .................. None
See application file for complete search history.

(56) References Cited

U.S. PATENT DOCUMENTS

| 6,114,074 A | 9/2000 | Carpi et al. |
| 2006/0046160 A1* | 3/2006 | Wallace et al. ................ 430/5 |

FOREIGN PATENT DOCUMENTS

| KR | 1020010076845 A | 8/2001 |
| KR | 1020070062865 A | 6/2007 |
| KR | 1020070112032 A | 11/2007 |
| WO | WO 2005/103828 A2 | 11/2005 |

* cited by examiner

*Primary Examiner* — John A. McPherson
(74) *Attorney, Agent, or Firm* — Kilpatrick Townsend & Stockton LLP

(57) ABSTRACT

An exposure mask provides a minute pattern formation which enables the high integration of semiconductor devices by preventing the generation of a scum in a space between a first pattern and a second pattern. The exposure mask includes a first pattern and a second pattern adjacent to the first pattern. A space is formed between the first pattern and the second pattern. The first pattern and the second pattern may each include a square wave shaped edge that is adjacent to the space. The square wave shaped edge includes a plurality of concave portions and convex portions.

20 Claims, 7 Drawing Sheets

US 8,197,991 B2

MANUFACTURING METHOD OF A SEMICONDUCTOR DEVICE

CROSS-REFERENCE TO RELATED APPLICATION

This application claims priority to Korean patent application number 10-2008-0022620, filed on Mar. 11, 2008, which is incorporated by reference in its entirety.

BACKGROUND OF THE INVENTION

The present invention relates to an exposure mask and a manufacturing method of a semiconductor device using the same, and particularly, to a method for preventing formation of a scum during a micro lithography process using asymmetric illumination.

As semiconductor devices and integrated circuit devices become more highly integrated, research has been conducted on resolution enhancement technology which can improve device properties and secure a process margin of the devices.

For instance, in a memory semiconductor device, the capacity of memory has been greatly increased and the critical dimension (CD) of a pattern for forming the device has been decreased.

As a result, an exposure process for generating the circuit diagram, which forms a pattern on a wafer, is considered to be more important than a lithography process.

To improve resolution, asymmetric illumination has been introduced in the exposure process. Particularly, when dipole illumination is performed, line and space of the circuit diagram can be provided in more detail.

A dipole aperture used during dipole illumination is equipped with a light-transmitting part in the Y-axis direction.

FIG. 1 shows a conventional semiconductor device formed with the lithographic process using a dipole aperture. A scum "a" is generated (e.g., due to acetone residue) in the X-axis direction.

FIG. 2 is a plane view of a conventional semiconductor device formed by the lithographic process using an exposure mask that includes a scattering space portion to prevent formation of the scum shown in FIG. 1.

When the exposure mask is applied to a semiconductor device having a design rule of more than 50 nm, the scum is not generated.

FIG. 3 (left side) shows a plane view of an exposure mask 100 which includes the scattering space portion of FIG. 2. As shown on the right side of FIG. 3, a simulation result shows a semiconductor device formed with the lithographic process using the exposure mask 100. The exposure mask 100 is applied to a semiconductor device having a design rule of less than 50 nm.

A scum 200 is generated but is smaller than the scum of FIG. 1.

FIG. 4 is a graph illustrating the relationship between a distance of the simulation result of FIG. 3 (indicated by the arrow in FIG. 3) and luminous intensity. The X-axis shows the distance values and the Y-axis shows the luminous intensity values. As seen in the center portion of the graph, the luminous intensity values are at a maximum at the distance values that correspond to the space and the scattering space portions of the exposure mask 100.

The likelihood of generating a scum is increased because the minimum values of the central portion of the graph are lower than the threshold energy level. For example, a scum may be generated at distances corresponding to luminous intensity values less than 2.3.

As described above, in the manufacturing method of a semiconductor device using the conventional exposure mask, when performing the lithographic process using asymmetric illumination to form a semiconductor device having a design rule of less than 50 nm, a scum is generated. In addition, when using the scattering space portion, the size of the scum is slightly reduced but the scum is still generated. Accordingly, it is difficult to implement the high integration of semiconductor devices.

BRIEF SUMMARY OF THE INVENTION

Embodiments of the present invention provide an exposure mask and a formation method of a semiconductor device capable of implementing the high integration of semiconductor devices by using the exposure mask.

According to an aspect of the present invention, an exposure mask includes a first pattern; and a second pattern adjacent to the first pattern. A space is formed between the first pattern and a second pattern. The first pattern includes a square wave shaped edge adjacent to the space. The square wave shaped edge includes a plurality of concave portions and a plurality of convex portions. A critical dimension of each concave portion ranges from 10 to 100 nm, and a depth of each concave portion ranges from 50 nm to 12.9 μm. Each convex portion of the square wave shaped edge is formed with a critical dimension which is one to one hundred times larger than the critical dimension of the concave portions. The width of the space between the first pattern and the second pattern ranges from 100 nm to 24.9 μm. The distance between the each concave portion of the first pattern and the second pattern ranges from 200 nm to 25 μm. The exposure mask may be used in a lithographic process using asymmetric illumination. The exposure mask may be used in a lithographic process using dipole illumination. The exposure mask may be a binary mask or a phase shifting mask. The first pattern and the second pattern may be line patterns or island patterns. The first pattern and the second pattern may be conduction wires or pads. The second pattern may also include a square wave shaped edge adjacent to the space.

According to another aspect of the present invention, a manufacturing method of a semiconductor device includes forming an underlying layer on a semiconductor substrate; forming a photoresist pattern on the underlying layer using an exposure mask including a first pattern, and a second pattern adjacent to the first pattern, wherein the first pattern includes a square wave shaped edge adjacent to a space formed between the first pattern and the second pattern; etching the underlying layer using the photoresist pattern as a mask; and removing the photoresist pattern to form an underlying layer pattern. The photoresist pattern may be formed using an asymmetric illumination. The photoresist pattern may be formed using di pole illumination. The second pattern may also include a square wave shaped edge adjacent to the space.

The present invention forms a first pattern and a second pattern on an exposure mask using asymmetric illumination. A space is formed between the first pattern and the second pattern. The first pattern includes a square wave shaped edge adjacent to the space. The second pattern may also include a square wave shaped edge adjacent to the space. Dipole illumination, quadrupole illumination, cross pole illumination, or quasar may be used as the asymmetric illumination. In addition, the first pattern and the second pattern may be line patterns or island patterns. The first pattern and the second pattern may be formed with conduction wire or pads.

A dipole aperture is equipped with a light-transmitting part in upper and lower portions. Thus, during dipole illumination, the resolution of a line pattern extending along a length thereof is excellent. However, the resolution of the line pattern across a width thereof is low.

DESCRIPTION OF EMBODIMENTS

Figure 5:
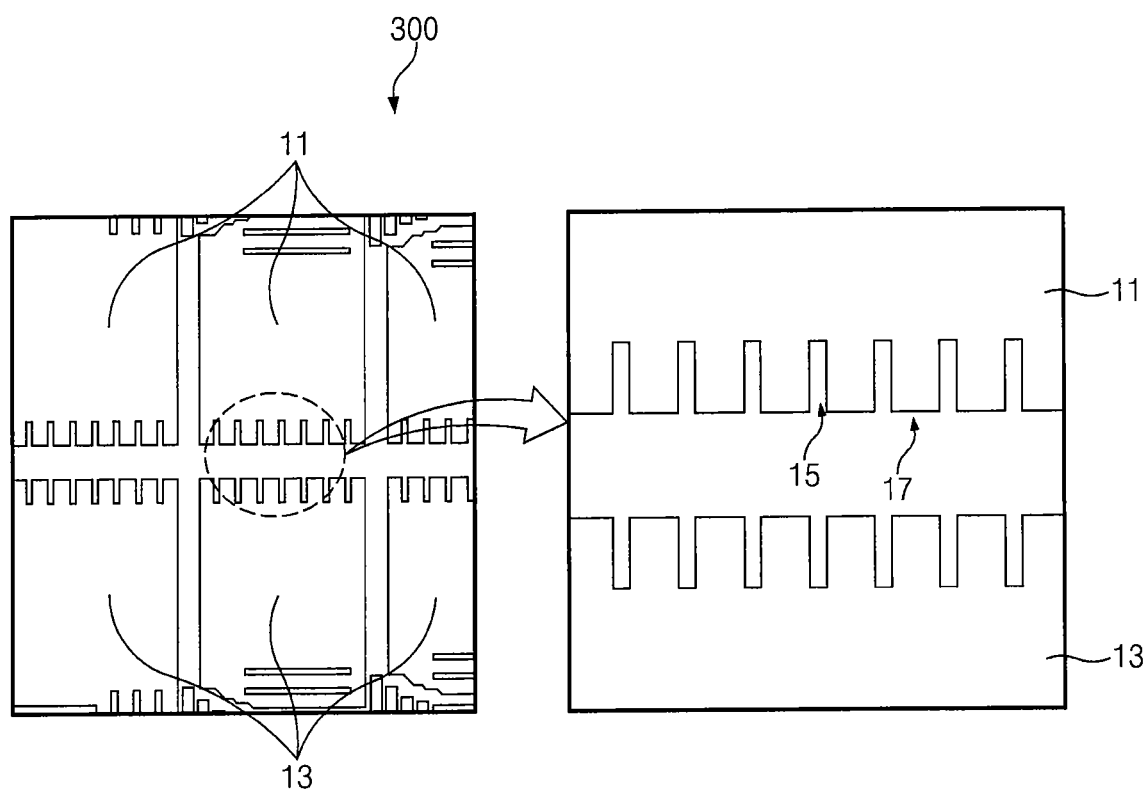
FIGS. 5 and 6 illustrate a layout and a simulation result of an exposure mask according to an embodiment of the present invention.

FIG. 5 is a plane view showing an exposure mask 300 having a first pattern 11 and a second pattern 13. A space is formed in the exposure mask 300 between the first pattern 11 and the second pattern 13. A circular region shown on the left side of FIG. 5 is enlarged on the right side of FIG. 5. The exposure mask 300 is one of a binary mask and a phase shifting mask.

The first pattern 11 is formed with a square wave shaped edge adjacent to the space, and the second pattern 13 is also formed with a square wave shaped edge adjacent to the space. The first pattern 11 and the second pattern 13 may be line patterns or island patterns. The first pattern 11 and the second pattern 13 may be formed of conduction wiring or pads. In one embodiment, the square wave shaped edge may be formed on only the first pattern 11 or only the second pattern 13 or both.

The square wave shaped pattern includes a plurality of concave portions 15 and a plurality of convex portions 17. A critical dimension of the concave portion 15 is 10 to 100 nm, and a depth of each concave portion is 50 nm to 12.9 μm. A width of the space between the first pattern 11 and the second pattern 13, that is, the distance between corresponding convex portions 17 of the first pattern 11 and the second pattern 13 is 100 nm to 24.9 μm. The distance between corresponding concave portions 15 of the first pattern 11 and the second pattern 13 is 200 nm to 25 μm. The convex portion 17 of the square wave shaped edge has a critical dimension which is one to hundred times larger than the critical dimension of the concave portion 15.

Figure 6:
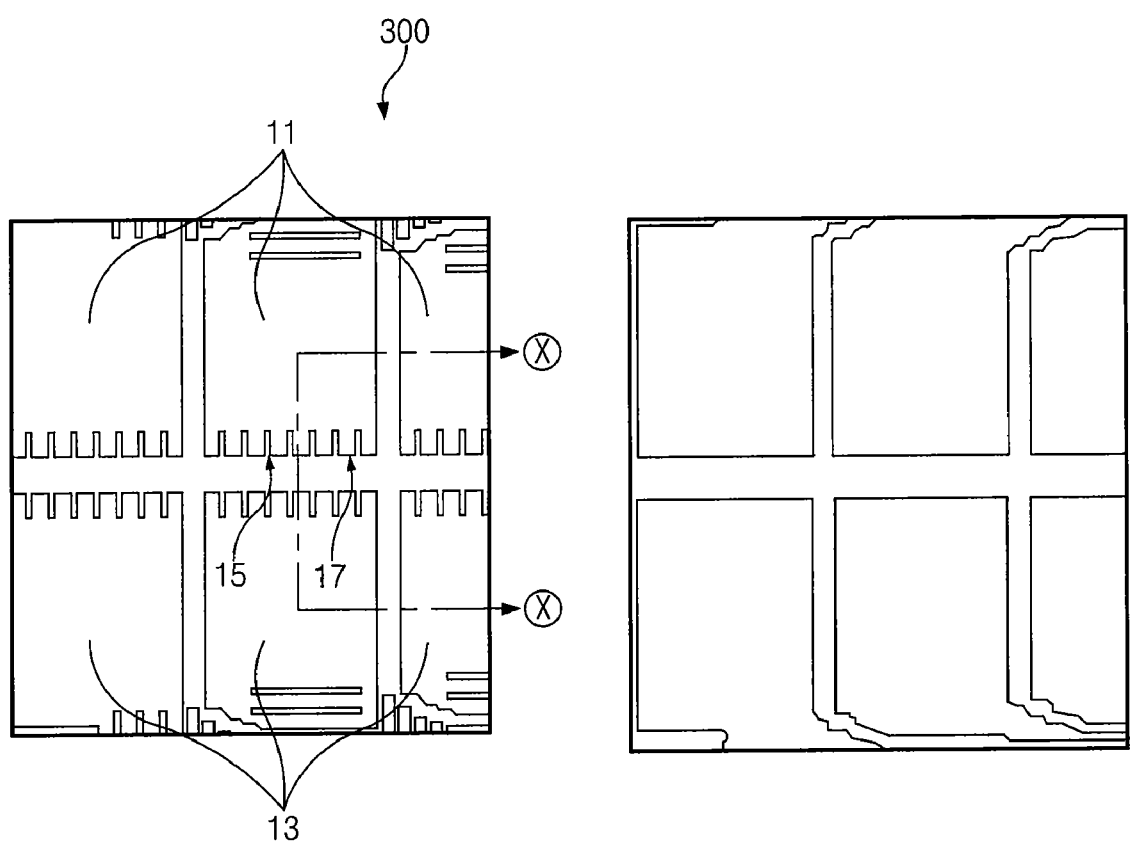

FIG. 6 is a plane view of an exposure mask 300. The left side of FIG. 6 shows the first pattern 11 and the second pattern 13 each including the square wave shaped edge with the concave portions 15 and the convex portions 17. The right side of FIG. 6 shows a simulation result of the exposure mask 300.

Figure 1:
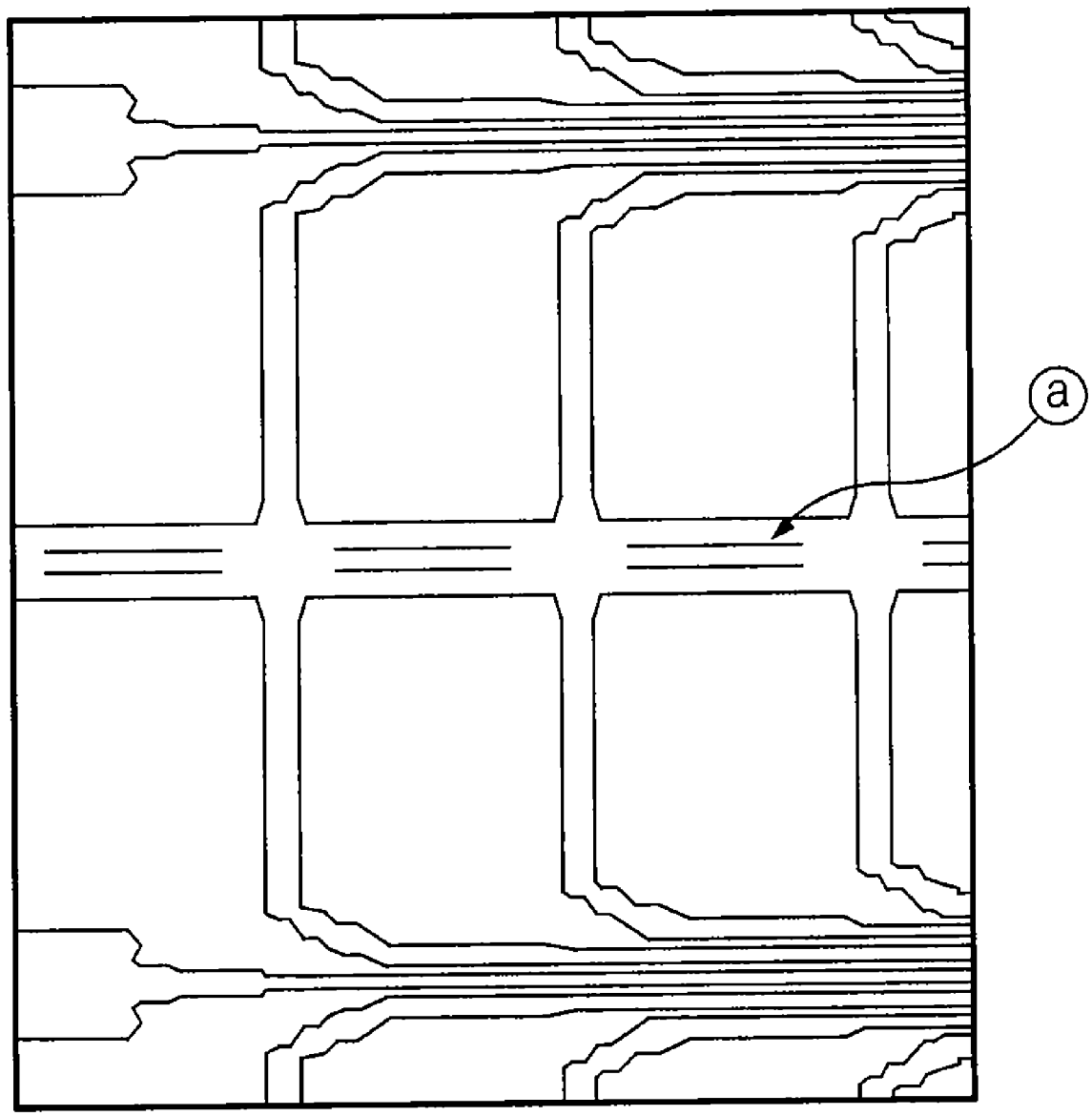
FIG. 1 shows a conventional semiconductor device formed by a lithographic process using a dipole aperture.
Figure 2:
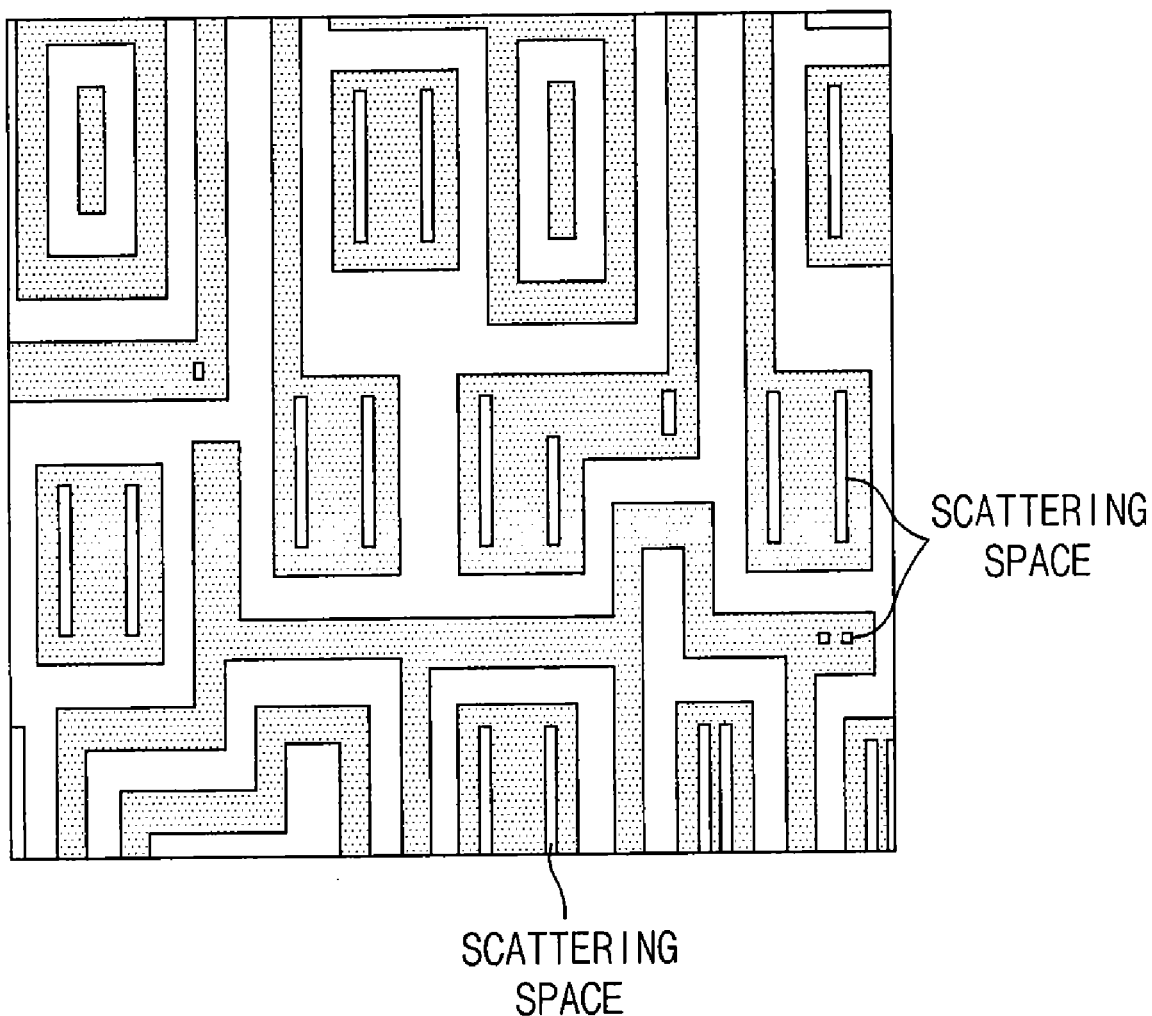
FIG. 2 is a plane view of a semiconductor device formed by the lithographic process using a conventional exposure mask.
Figure 3:
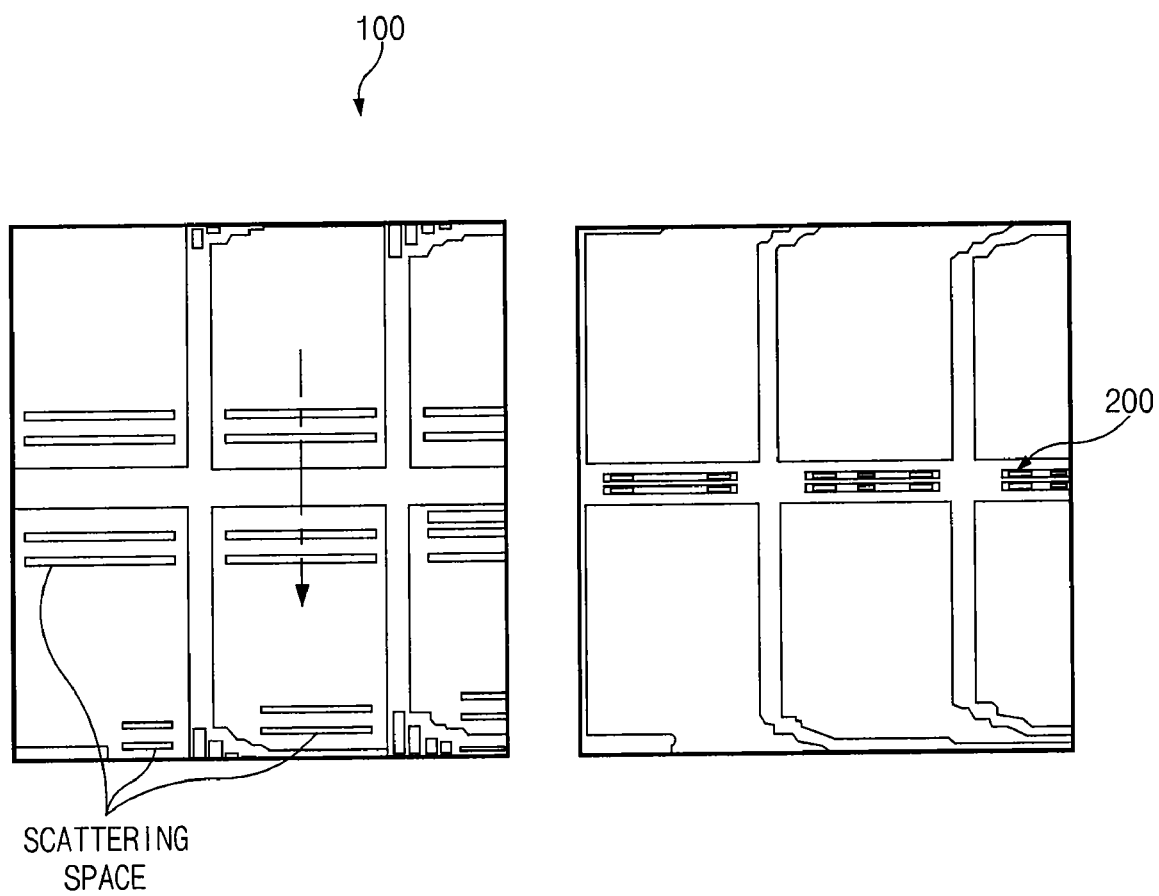
FIG. 3 shows a layout and a simulation result of a conventional exposure mask in which a scattering space portion is formed.

As shown in FIG. 6, the scum "a" of FIG. 1 and the scum 200 of FIG. 3 are not formed on the exposure mask 300 of the present invention.

Figure 4:
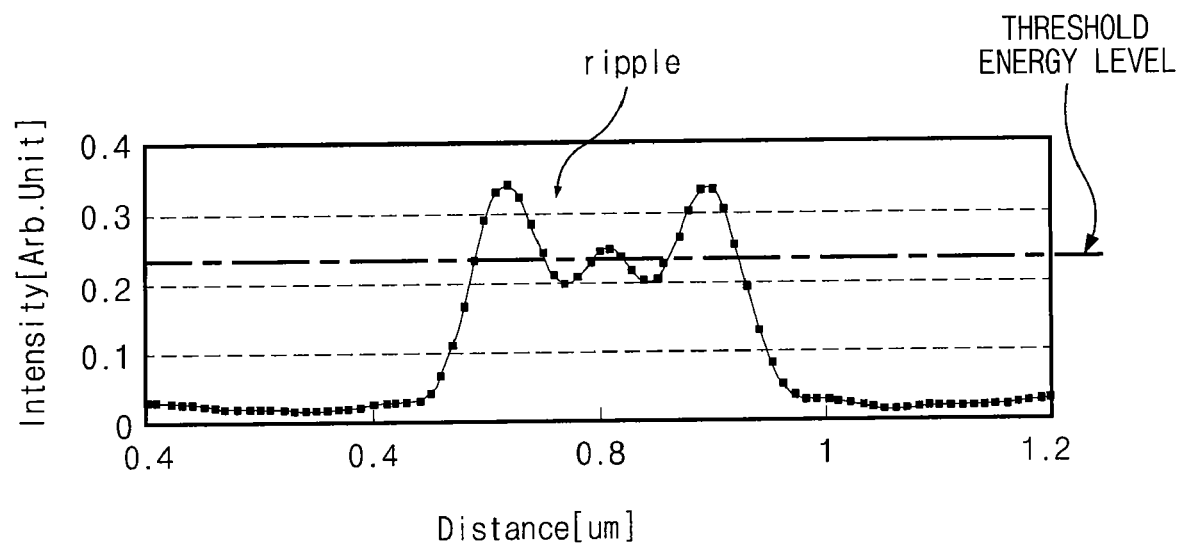
FIG. 4 is a graph showing a relationship between distance and light intensity of the simulation result of FIG. 3.
Figure 7:
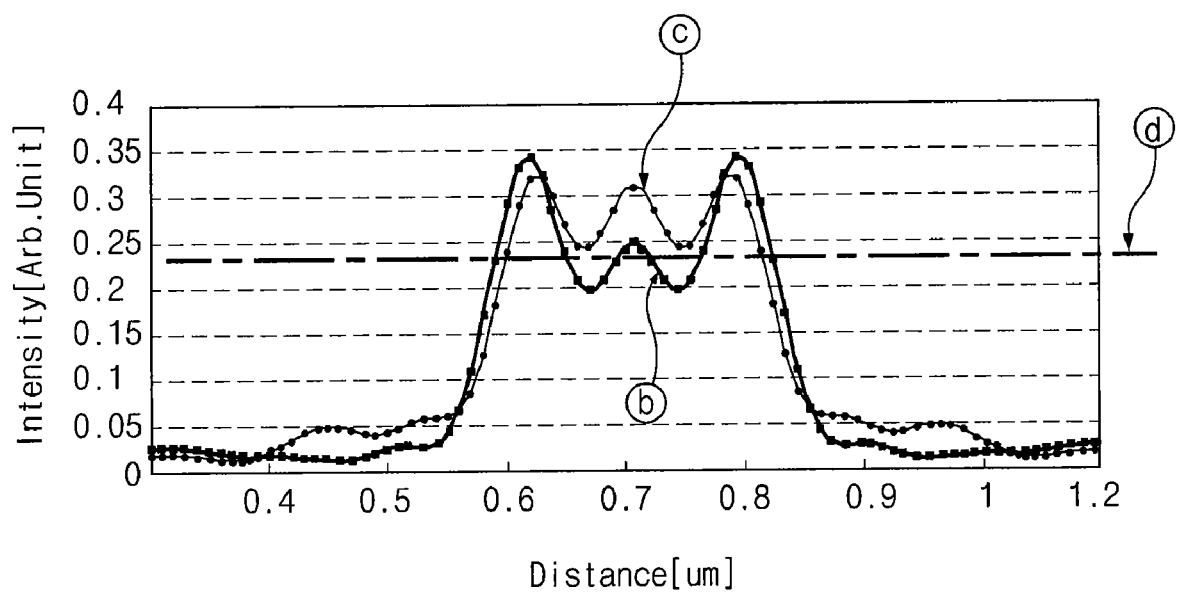
FIG. 7 is a graph that illustrates a comparison between a conventional exposure mask and an exposure mask in accordance with the present invention with regard to a relationship between distance and light intensity.

FIG. 7 is a graph illustrating the distribution of light intensity along a cross section X-X of the exposure mask 300 shown in FIG. 6. The graph ⓑ shows the distribution of light intensity according to the conventional art (also shown in FIG. 4), and the graph ⓒ shows the distribution of light intensity according to the present invention.

As shown in FIG. 7, in a center portion of graph ⓑ, two portions of the graph include minimum values that are lower than a threshold energy level ⓓ. Thus, a scum is generated in the exposure mask 300 during the lithographic process at distances corresponding to the minimum values of light intensity.

The threshold energy level ⓓ refers to a threshold energy value which completely exposes the photoresist layer of a region to be exposed in the exposure process. Referring to a center portion of the graph ⓒ according to the present invention, all of the values of graph ⓒ are higher than the threshold energy level ⓓ. Thus, scum generation is prevented in the lithographic process.

Another embodiment of the present invention provides an exposure mask including a square wave shaped edge on one of the first pattern or the second pattern that is adjacent to the space formed between the first pattern and the second pattern.

The formation method of a semiconductor device using the exposure mask 300 of FIG. 5 according to the present invention is described as follows:

1. An underlying layer is formed on a semiconductor substrate. A hard mask layer and a stack structure of an etch mask or a single structure of the hard mask layer may be formed on the underlying layer.

2. A photoresist pattern is formed on the underlying layer. The photoresist pattern is formed as the exposure mask 300 shown in FIG. 5. Thus, the photoresist pattern includes the first pattern 11 and the second pattern 13 including the square wave shaped edges formed adjacent to a space between the first pattern 11 and the second pattern 13. The semiconductor device is formed by an exposure and development process using the exposure mask 300. The exposure process is performed using asymmetric illumination. It is preferable that dipole illumination is used for the asymmetric illumination.

3. An underlying layer pattern is formed by etching a structure formed on the semiconductor substrate to expose the semiconductor substrate using the photoresist pattern as a mask. The photoresist pattern may then be removed.

It will be apparent to those skilled in the art that various modifications can be made in the present invention without departing from the spirit or scope of the invention. Thus, it is intended that the present invention cover the modifications of this invention provided they lie within the scope of the appended claims and their equivalents.

What is claimed is:

1. An exposure mask comprising:
   a first pattern array including a plurality of first patterns, two of the first patterns being separated by a first space; and
   a second pattern adjacent to the first pattern array, wherein a second space is formed between the first pattern array and the second pattern,
   wherein at least one of the first patterns comprises a square wave shaped edge that is adjacent to the second space, the square wave shaped edge comprising a plurality of concave portions and convex portions,
   wherein the edges the two first patterns that are separated by the first space do not have the square wave shape.

2. The exposure mask of claim 1, wherein a critical dimension of each concave portion ranges from 10 to 100 nm, and a depth of each concave portion ranges from 50 nm to 12.9 μm.

3. The exposure mask of claim 1, wherein each convex portion has a critical dimension, which is one to hundred times larger than a critical dimension of each concave portion.

4. The exposure mask of claim 1, wherein a width of the second space between the first pattern and the second pattern ranges from 100 nm to 24.9 μm.

5. The exposure mask of claim 1, wherein a distance between each concave portion of the first pattern array and the second pattern ranges from 200 nm to 25 μm.

6. The exposure mask of claim 1, wherein the exposure mask is used in a lithographic process using asymmetric illumination.

7. The exposure mask of claim 1, wherein the exposure mask is used in a lithographic process using dipole illumination.

8. The exposure mask of claim 1, wherein the exposure mask is one of a binary mask and a phase shifting mask.

9. The exposure mask of claim 1, wherein the first patterns and the second pattern are line patterns or island patterns.

10. The exposure mask of claim 1, wherein the first patterns and the second pattern comprise conduction pads.

11. The exposure mask of claim 1, wherein the second pattern comprises a square wave shaped edge adjacent to the second space.

12. A manufacturing method of a semiconductor device, the method comprising:
    forming an underlying layer over a semiconductor substrate;
    forming a photoresist pattern over the underlying layer, wherein the photoresist pattern is formed using an exposure mask;
    etching the underlying layer using the photoresist pattern as a mask to form an underlying layer pattern; and
    removing the photoresist pattern,
    wherein the exposure mask includes
        a first pattern array including a plurality of first patterns, two of the first patterns being separated by a first space; and
        a second pattern adjacent to the first pattern array, wherein a second space is formed between the first pattern array and the second pattern,
        wherein at least one of the first patterns comprises a square wave shaped edge that is adjacent to the second space, the square wave shaped edge comprising a plurality of concave portions and convex portions,
        wherein the edges the two first patterns that are separated by the first space do not have the square wave shape.

13. The manufacturing method of claim 12, wherein the photoresist pattern is formed using asymmetric illumination.

14. The manufacturing method of claim 12, wherein the photoresist pattern is formed using dipole illumination.

15. The manufacturing method of claim 12, wherein the second pattern comprises a square wave shaped edge adjacent to the space.

16. An exposure mask comprising:
    a first pattern array including a plurality of first patterns, two of the first patterns being separated by a first space; and
    a second pattern array including a plurality of second patterns, two of the second patterns being separated by a second space, the first pattern array and the second pattern array being separated by a third space,
    wherein edges of the first pattern array and the second pattern array, adjacent to the third space, have a square wave shape, the square wave shaped edge including a plurality of concave portions and convex portions,
    wherein edges of the two first patterns that are separated by the first space and edges of the edges of the two second patterns that are separated by the second space do not have the square wave shape.

17. The exposure mask of claim 16, wherein a critical dimension of each concave portion ranges from 10 to 100 nm, and a depth of each concave portion ranges from 50 nm to 12.9 μm.

18. The exposure mask of claim 16, wherein each convex portion has a critical dimension, which is one to hundred times larger than a critical dimension of each concave portion.

19. The exposure mask of claim 16, wherein a width of the first space and a width of the second space ranges from 100 nm to 24.9 μm.

20. The exposure mask of claim 16, wherein a distance between each concave portion of the first pattern array and the second pattern array ranges from 200 nm to 25 μm.

* * * * *